United States Patent [19]

Kimoto et al.

[11] Patent Number: 4,486,891
[45] Date of Patent: Dec. 4, 1984

[54] CONTACT POINT TYPE MEASURING DEVICE

[75] Inventors: Teruo Kimoto; Yasuyuki Yamaguchi; Takeji Nishimura; Satoshi Mizuno, all of Kawasaki, Japan

[73] Assignee: Mitutoyo Mfg. Co., Ltd., Tokyo, Japan

[21] Appl. No.: 342,922

[22] Filed: Jan. 26, 1982

[30] Foreign Application Priority Data

Jan. 27, 1981 [JP] Japan .................................. 56-10465
Jan. 27, 1981 [JP] Japan .................................. 56-10466

[51] Int. Cl.³ ............................................. G01B 7/00
[52] U.S. Cl. ........................................ 377/24; 33/166
[58] Field of Search ................. 377/19, 24; 33/166, 33/125 C

[56] References Cited

U.S. PATENT DOCUMENTS

| | | | |
|---|---|---|---|
| 3,142,121 | 7/1964 | Stefanov | 33/143 L |
| 4,103,427 | 8/1978 | Ledley | 33/166 |
| 4,227,308 | 10/1980 | Talansky et al. | 33/169 B |
| 4,255,861 | 3/1981 | Nakata et al. | 33/166 |

Primary Examiner—John S. Heyman
Attorney, Agent, or Firm—Koda & Androlia

[57] ABSTRACT

A contact point type measuring device being equipped with contact point type encoder having scale contact points and brushes to supply pulse type measured signals, a counter circuit and a display section of measured value, such device comprising the scale contact points consisted of larger scale contact points arranged in a required distance and of smaller scale contact points dividing the larger scale contact point distance at a certain required pitch, the counter circuit including a larger scale counter counting larger scale measured signals obtained from the larger scale contact points and a smaller scale counter counting small scale measured signals obtained from the smaller scale contact points and resetting such counted value by the larger scale measured signals, and the display section of measured value including an upper figure displayer displaying counted value of the larger scale counter and a lower figure displayer displaying counted value of the lower scale counter, and parts of such device being manufactured with extreme ease and accuracy by mass production.

11 Claims, 15 Drawing Figures

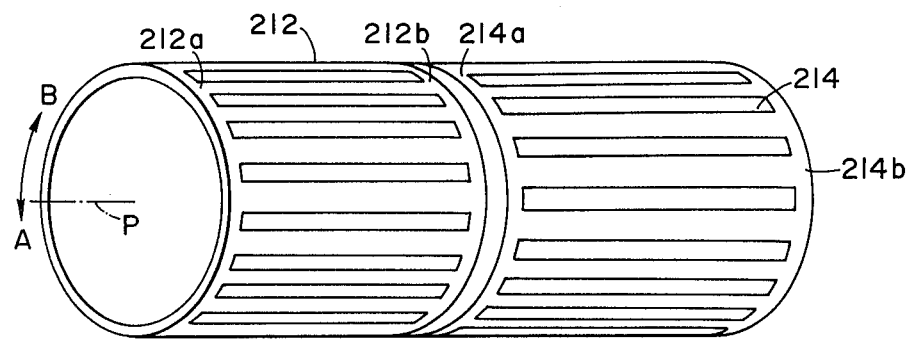
FIG. 9
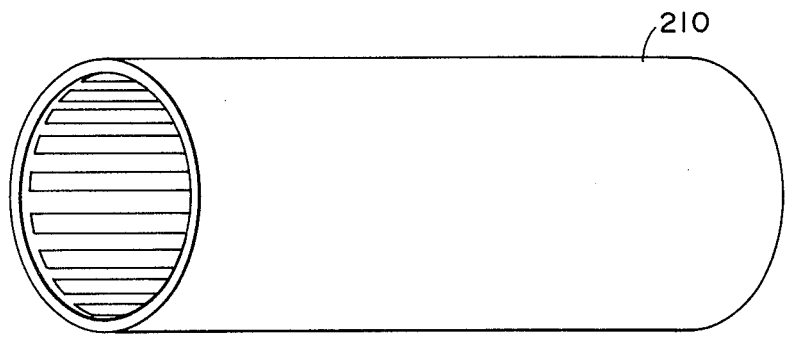
FIG. 10
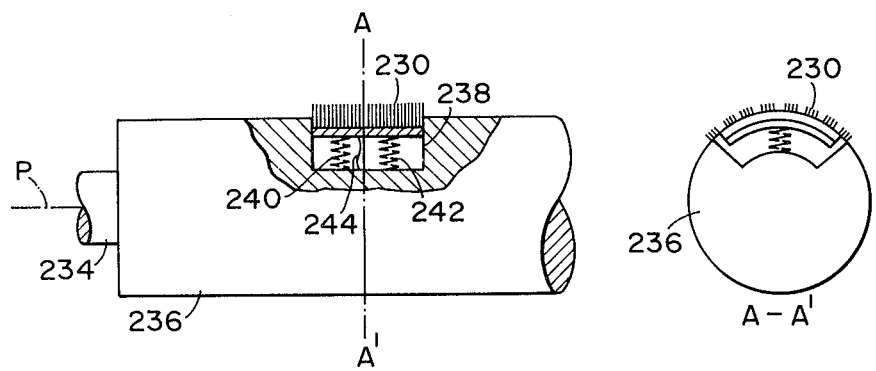
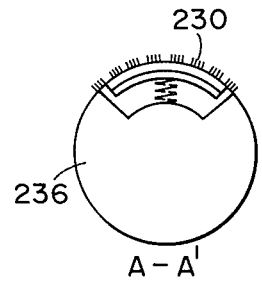
FIG. 11          FIG. 12

CONTACT POINT TYPE MEASURING DEVICE

BACKGROUND OF THE INVENTION

1. Field of Invention

This invention relates to a contact point type measuring device equipped with contact type encoder.

2. Description of Prior Art

Such means that the mechanical displacement of measuring members is detected as electric digital signals is well known and applied to various measuring fields as length measuring machines, position detectors, or the like. The mechanical displacement detecting means of this kind electrically detects length of a measured object as displacing amount of scale or the like. Electromagnet, electrostatic, photoelectric or various types are known as such electric detecting means, and, especially, the displacing detecting means of photoelectric conversion type is of wide and practical use as micrometers, vernier calipers, coordinate measuring machines, etc. due to the advantages of possibility of minimization and highly accurate measurement by such detecting means.

The conventional means of this type, however, has such drawbacks that it comparatively costs high and that it comparatively consumes large electric current. Since small type length measuring machines recently use batteries in order to drive the machines, it is requested that the means has long life and consumes low electric current. In the digital type displacing detector the electric process is performed by C-MOS circuits and these processing circuits consume remarkably low electric current. Contrary to this, in the photoelectric means of the conventional type, light emitters for photoelectric conversion, light emitting diodes for example, consume large electric current, which increases total consumption of electric current.

Apart from the above mentioned contactless type encoder, known is a contact point type encoder which detects electric digital signals from on and off action by contact points. The contact point type encoder has such advantage that it has simple structure and can electrically detect mechanical displacement, and is of practical use in certain fields. It is, however, used in such fields as positioning means or revolving position detector in large type driving means which does not require accuracy, and the application of the contact type is not considered in the fields, especially, in the length measuring machines, wherein small and accurate type is required. In other words, the contact point type of this kind is of low reliability and has such fundamental drawbacks that the contact conditions is extremely unstable, and long time use easily changes the contact conditions. Therefore, it is impossible for the contact point type encoder to be equipped in length measuring machines, etc. in which poor contact directly causes in error.

On the other hand, this contact point type encoder has such advantages that the voltage application can convert mechanical displacement into electric digital pulses and that no consumption of electric current is basically required. These advantages are applied to small type measuring devices which can consume low electric current and be driven by batteries by means of combining with recent voltage type elements, C-MOS transistors for example.

It is considered preferrable that the measuring device is composed of a contact point type encoder, a counter circuit section which consists of C-MOS transistors and IC's to count voltage pulses of the contact point type encoder, and a display section of measured value which consists of LCD (liquid crystal display) to display the counted value of the counter circuit as measured value. The composition of the measuring device mentioned above can provide the measuring device of low price and low current consumption.

However, since the voltage type elements of C-MOS type transistors and IC's are not suitable for high speed action, in case the measuring device is composed as described in the above, it is impossible for the measuring device to follow fast moving measuring members and there occurs error in the measured value displayed in the display section, when high frequency signals are supplied from the contact point type encoder as measured signals. Therefore, the measuring device having the composition mentioned in the above is extremely inconvenient in practical use.

SUMMARY OF THE INVENTION

Accordingly, it is a general object of the present invention to provide a contact point type measuring device which does not cause in errors in displayed measured value in case of high speed movement of measuring members.

In keeping with principles of the present invention, the object is accomplished with a contact point type measuring device which includes a contact point type encoder having scale contact points arranged in regular order in required direction and brushes correspondingly moving along together with the measuring members against the scale contact points with repetition of on and off contact with the scale contact points and supplying pulse type measured signals in accordance with the measured amount, a counter circuit which counts pulse numbers of the measured signals, wherein the scale contact points consists of larger scale contact points arranged in a required distance and of smaller scale contact points dividing the larger scale contact point distance at a certain required pitch; and the counter circuit includes a larger scale counter counting larger scale measured signals obtained from the larger scale contact points and a smaller scale counter counting small scale measured signals obtained from the small scale contact points and resetting such counted value by the larger scale measured signals, and a display section of measured value which includes a upper figure displayer displaying counted value of the larger scale counter as upper figures and a lower figure displayer displaying counted value of the smaller scale counter as lower figures.

BRIEF DESCRIPTION OF DRAWINGS

The above mentioned features and the object of the present invention will become more apparent by reference to the following description in conjunction with the accompanying drawings, wherein like referenced numerals denote like elements, and in which:

FIG. 9 is an illustation showing composition of the fifth preferred embodiment in accordance with the teachings of the present invention;

FIGS. 10, 11, 12 and 13 are illustrations showing composition of the sixth preferred embodiment in accordance with the teachings of the present invention;

DETAILED DESCRIPTION OF THE EMBODIMENTS

Figure 1:
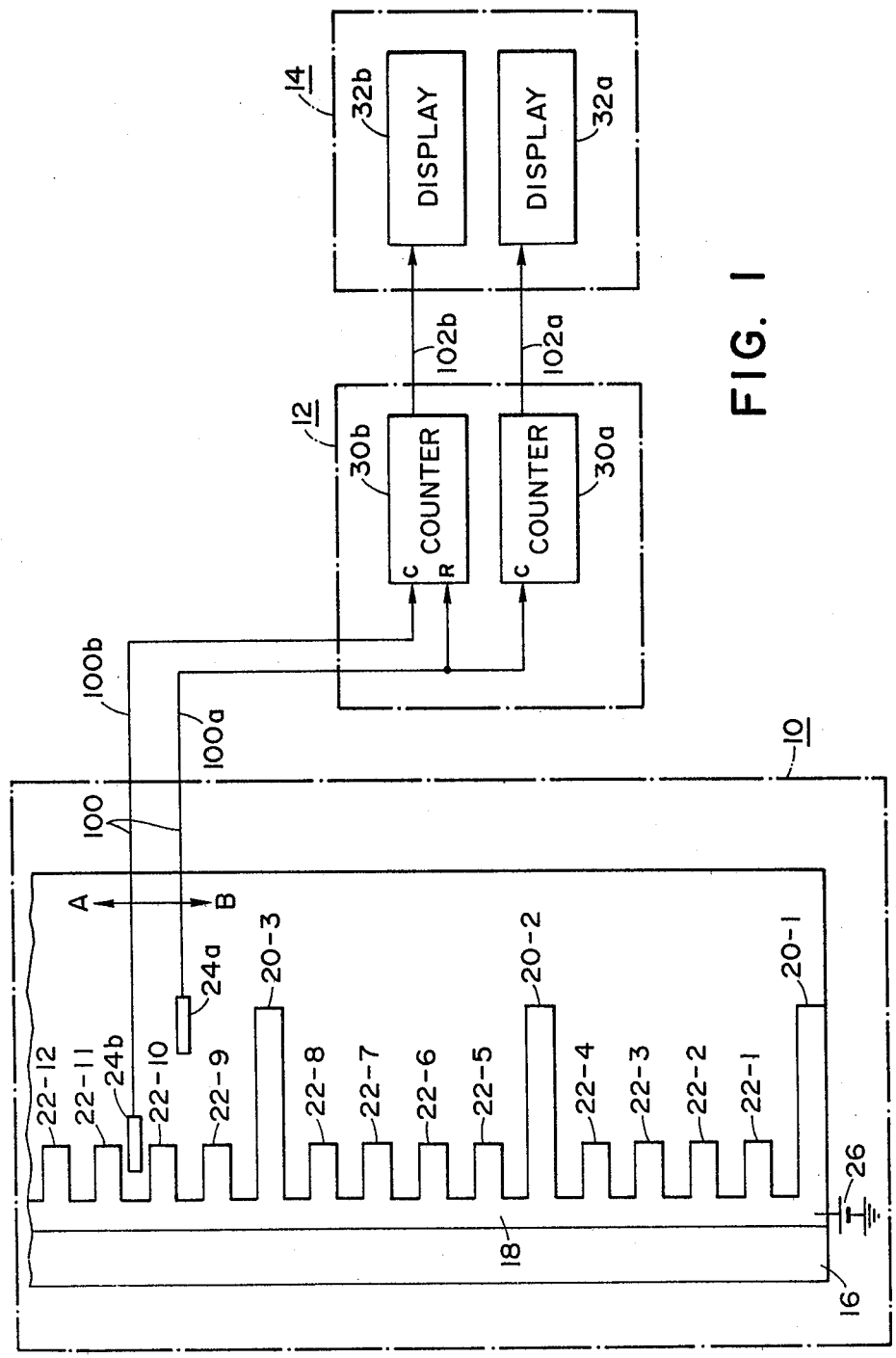
FIG. 1 is an illustration showing composition of the first preferred embodiment in accordance with the teachings of the present invention.

Referring more particularly to the drawings, shown in FIG. 1 is the first embodiment in accordance with the teachings of the present invention. In Figure the embodiment is composed of a contact point type encoder 10 which supplies pulse type measured signals 100 in accordance with the measured amount, a counter circuit 12 which counts numbers of pilse of the measured signals 100, and a display section 14 of measured value which displays the measured amount in digital display with the basis of counted value of the counter circuit 12.

In the contact point type encoder 10, the scale contact points consisting of conductor which is formed on the fixed contact point base 16 are arranged in regular order to A-B direction, and each of contact points is commonly connected by a conducting plate 18 consisting of conductor which is formed on the contact point base 16 and being arranged longer to the A-B direction. The scale contact points are composed of larger scale contact points 20-1, 20-2, 20-3,—which shape like piano keys and are arranged in regular order and distance, and of smaller scale contact points 22-1, 22-2, 22-3,—which also shape like piano keys and divides the larger scale contact point 20 into certain distances. The larger scale contact points 20-1, 20-2, 20-3,—and the smaller scale contact points 22-1, 22-2, 22-3,—extend long to a direction across the A-B direction from the conducting plate 18 toward the right direction as shown in Figure, and the larger scale contact points 20-1, 20-2, 20-3,—extend longer than the smaller scale contact points 22-1, 22-2, 22-3,—. Prepared thereon are the first brush 24a and the second brush 24b, both of which move along the A-B direction at constant corresponding position together with the movement of the measuring members, not illustrated. The first brush 24a can slidingly contact with the larger scale contact points 20 and the second brush 24b can slidingly contact with both of the larger scale contact points 20 and the smaller scale contact points 22. The larger scale contact points 20 and the smaller scale contact points 22 are commonly connected to a battery 26 by way of the conducting plate 18. The measured signals 100 consist of a larger scale measured signal 100a and a smaller scale measured signal 100b. The larger scale measured signal 100a is supplied from the first brush 24a and the smaller scale measured signal 100b is supplied from the second brush 24b to the counter circuit 12 respectively.

The larger scale measured signal 100a supplied to the counter 12 is output to a count input of the first counter 30a and a reset input of the second counter 30b, and the other smaller scale measured signal 100b is supplied to a count input of the second counter 30b. The counters 30a and 30b are composed of C-MOS type transistors, IC's, etc.

Each of the counted values 102a and 102b of each of the counters 30a and 30b is supplied to a display section 14. The counted value 102a from the counter 30a is supplied to a upper figure displayer (LCD) 32a which displays the measured value as upper figures, and the counted value 102b from the counter 30b is supplied to a lower figure displayer (LCD) 32b which displays the measured value as lower figures.

The first preferred embodiment of the present invention is composed as described in the above and its operation will be described hereinafter.

Figure 2:
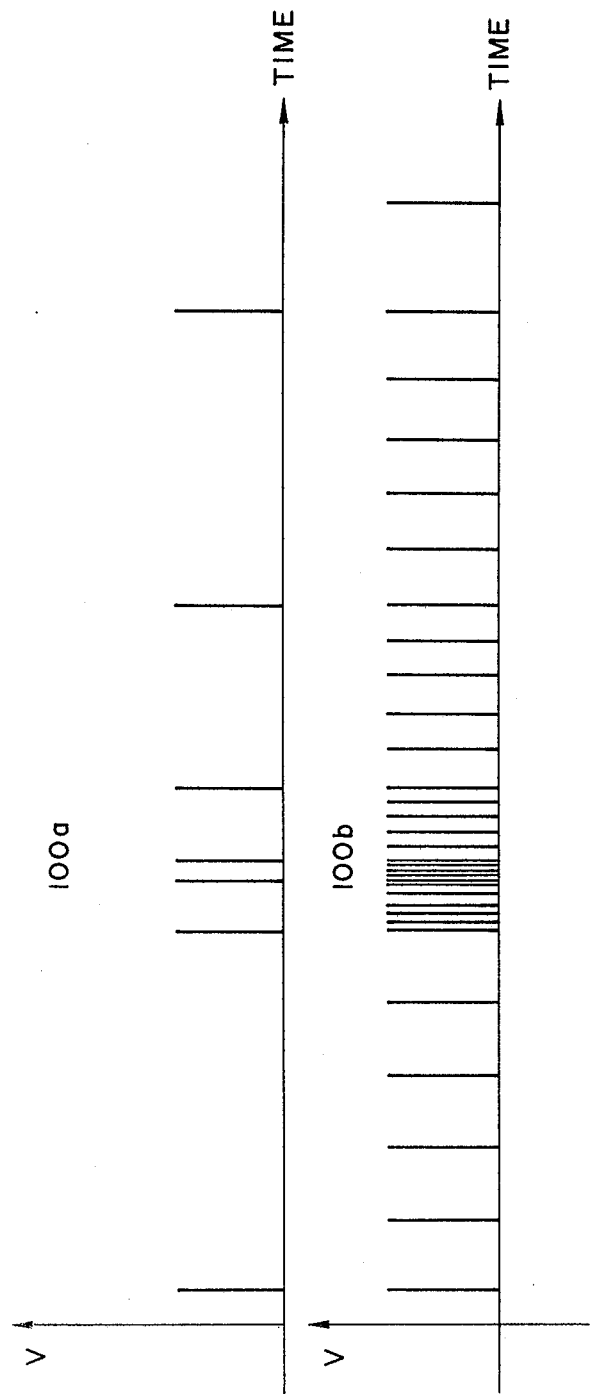
FIG. 2 is wave form charts of measured signals 100 in the embodiment shown in FIG. 1.

When the measured value of the amount corresponding to the measured value is moved, the brushes 24a and 24b are correspondingly moved along against the scale contact points at the same time. Consequently, the larger scale measured signal 100a and the smaller scale measured signal 100b shown in FIG. 2 are supplied to the counters 30a and 30b respectively to be counted. The counter 30b is put in the reset stage whenever the larger scale measured signal 100a generates its pulse. The upper figure displayer 32a and the lower figure displayer 32b display the numbers of upper figures and lower figures in digital display by means of respective measured values so that an operator can read the figures.

When the measuring members move faster, it is impossible to count the small scale measured signal 100b since the pulse intervals of the smaller scale measured signal 100b become shorter. In this case, however, the pulse intervals of the larger scale measured signal 100a is not so shorter that the counting action at the counter 30a continues on and the upper figure displayer 32a displays the upper figures of the measured value. Just before the measuring members stop moving, it becomes possible to count the smaller scale measured signal 100b of the counter 30b and the lower figures of the measured value can be displayed with accuracy when the measuring members are about to stop moving.

As described heretofore, according to the embodiment, the measured value can be displayed without error when the measuring members move faster.

Figure 3:
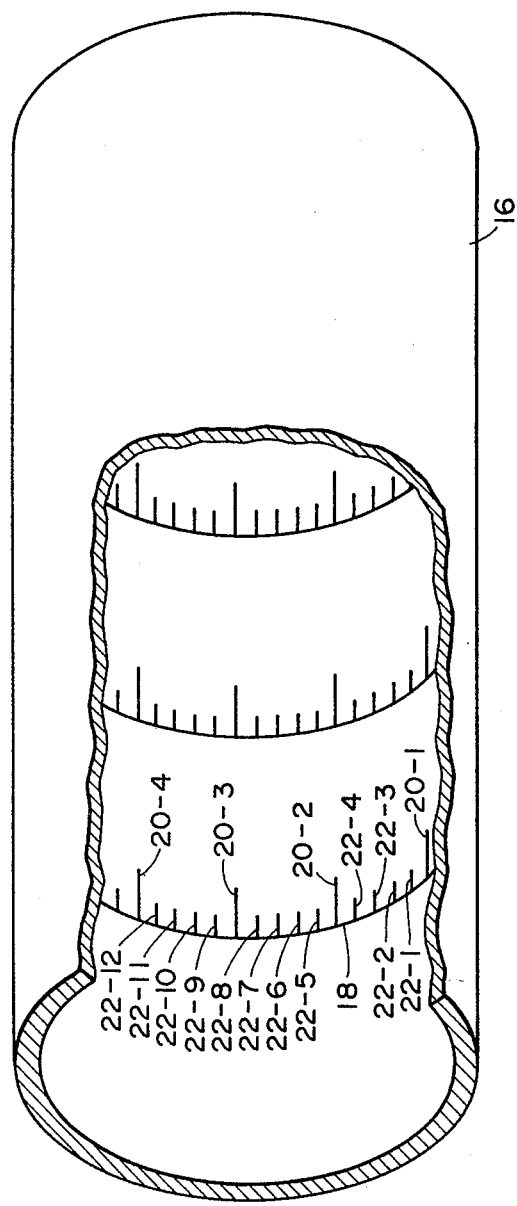
FIG. 3 is an illustration showing composition of the second preferred embodiment in accordance with the teachings of the present invention.

In FIG. 3 shown therein is the second preferred embodiment in accordance with the teachings of the present invention, wherein like referenced numerals denote like elements in FIG. 1 and the description will be omitted.

In FIG. 3, it is characterized that the contact point base 16 is cylindrically formed.

This embodiment has such advantage that the contact point base 16 can be prepared smaller and that the larger scale contact points 20 and the smaller scale contact points 22 can be contacted by the brushes 24a and 24b, which are not illustrated in Figure, at constant pressure. The larger scale contact points 20 and the smaller scale contact points 22 can be installed on the outer surface of the contact point base 16 and the contact point base 16 can be made of solid column in this case.

Figure 4:
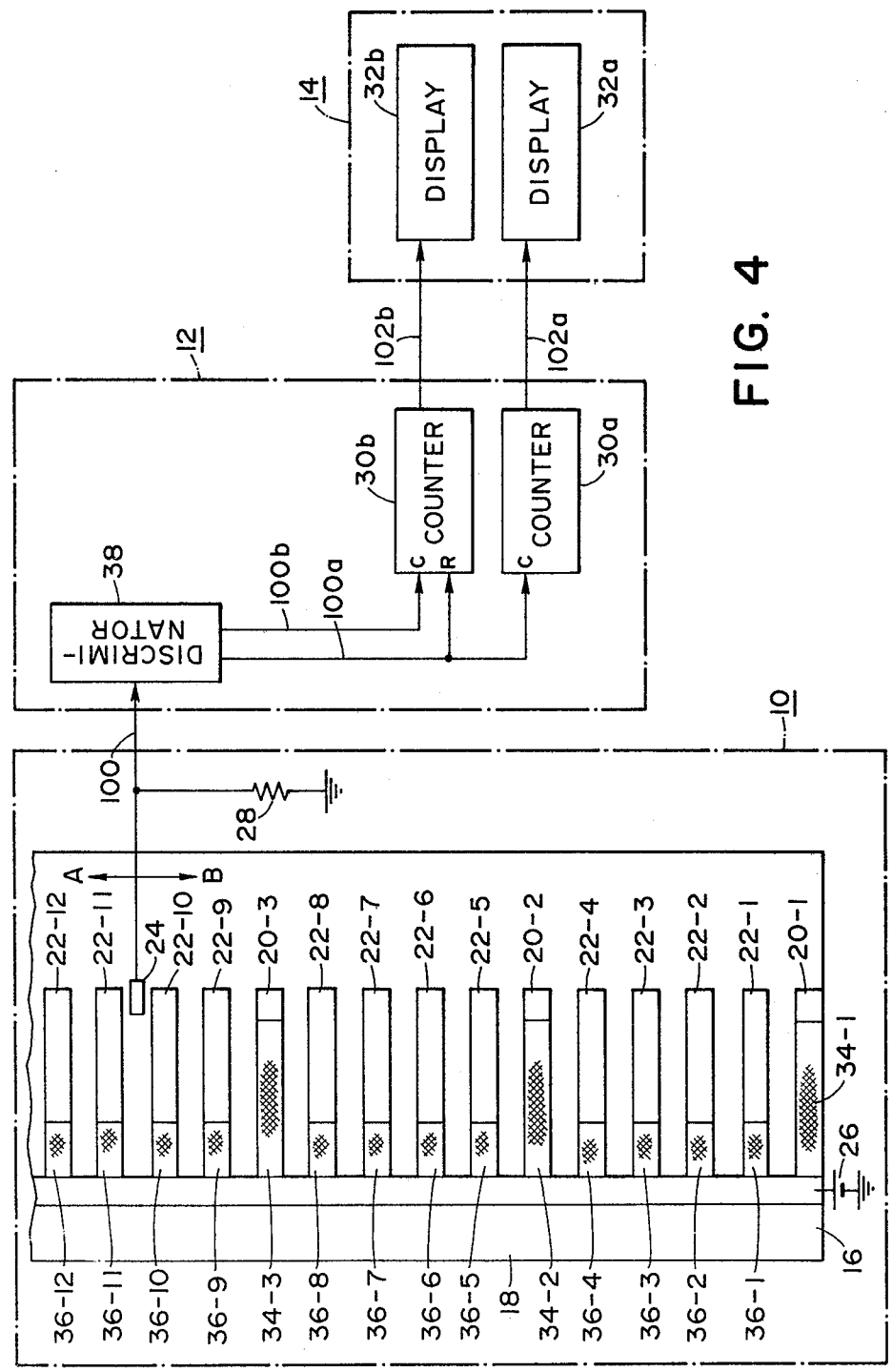
FIG. 4 is an illustration showing composition of the third preferred embodiment in accordance with the teachings of the present invention.

In FIG. 4 shown therein is the third preferred embodiment in accordance with the teachings of the present invention, wherein like referenced numerals denote like elements in Figures explained in the above and description will be omitted.

In the embodiment it is characterized that the larger scale contact points 20 and the smaller scale contactpoints 22 respectively connected to the conducting plate 18 by way of resistance plates 34 and 36 each of which has different resistive value, and that the larger scale contact points 20 and the smaller scale contact points 22 are arranged in same length so that the one brush 24 can slidingly contact and move along the end points of the larger scale contact points 20 and the smaller scale contact points 22 in this embodiment. The measured signal 100 is supplied to a measured signal selecting circuit 38 which is prepared in the counter circuit 12, and selects the larger scale measured signal 100a and the smaller scale measured signal 100b with the basis of voltage difference of the measured signal 100 to output to the counters 30a and 30b.

The embodiment in FIG. 4 is composed as mentioned in the above and its operation will be described hereinafter.

Figure 5:
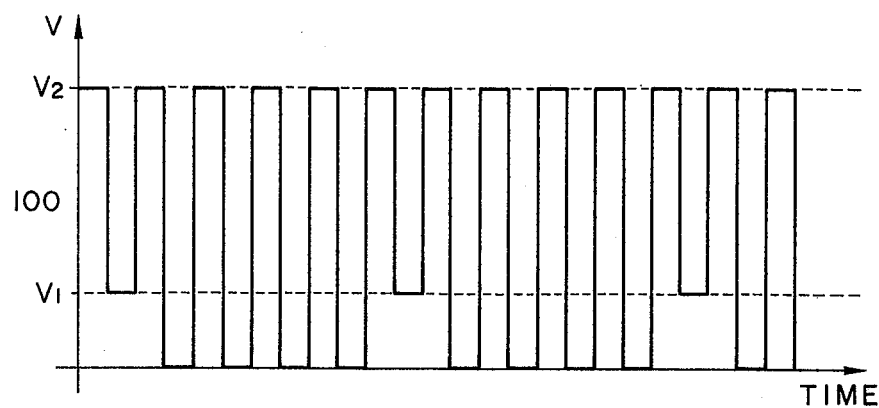
FIG. 5 is a wave form chart of measured signal 100 in the embodiment shown in FIG. 4.

In this embodiment the resistive value of the resisters 34 is determined higher than the one of the resisters 36 and the measured signal 100 shown in FIG. 5 is supplied to the measured signal selecting circuit 38 when the measuring members move along. The signal selecting circuit 38 outputs the larger scale contact point signal 100a when the measured signal becomes $V_1$ and the smaller scale contact point signal 100b when the measured signal 100 becomes $V_2$. Consequently, the larger scale contact point signal 100a and the smaller scale contact point signal 100b can be supplied to the counter 30a and 30b respectively in the same way as described with FIG. 2.

This embodiment has such advantage that one set of brush 24 can make it easy to produce the contact point type encoder 10.

As described heretofore, the present invention can provide the contact point type measuring device without measuring error when the measuring members move along faster.

In the present invention it is preferrable that one brush other than the brush 24 used in the above mentioned embodiment is installed at the phase of same phase with the brush 24 in order not to generate pulses of error against the measured signals, and it is also preferrable that another brush other than the brush 24 is installed at the phase of different phase from the brush 24 in order to distinguish the moving direction of the measuring members.

As described in the second embodiment, according to the present invention, the contact point base can be composed of cylinder or column, and the embodiments using the contact point base of this kind will be described hereinafter. In the following embodiments, the larger scale contact points and the smaller scale contact points will not be distinguished but simply described as slide contact points.

Figure 6:
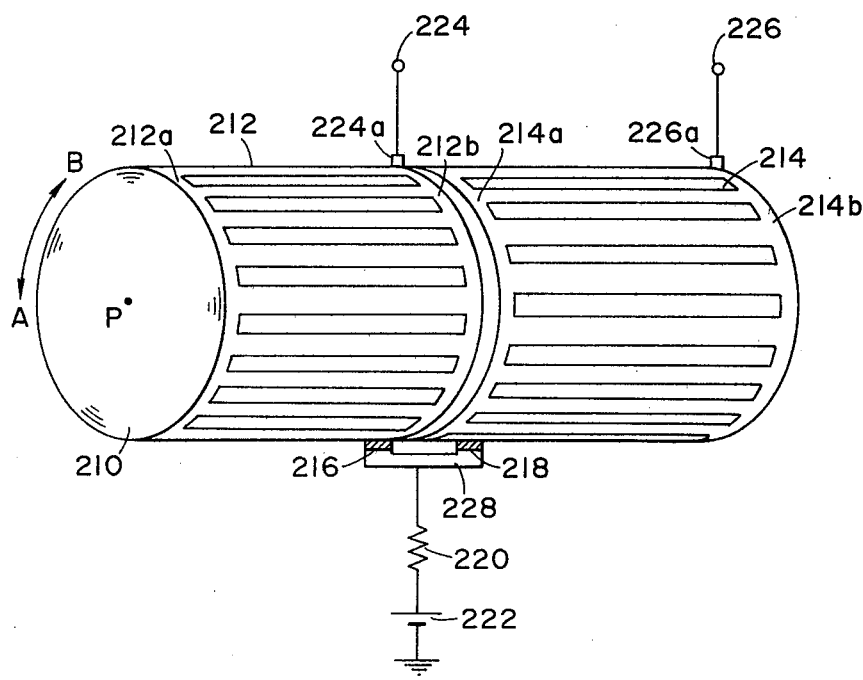
FIG. 6 is an illustration showing composition of the fourth preferred embodiment in accordance with the teachings of the present invention.

In FIG. 6 shown therein is the fourth preferred embodiment in accordance with the teachings of the present invention.

In this embodiment the contact point base 210 consists of solid column type insulater and can be revolved together with the movement or the rotation of the measuring members, which is not illustrated. Each of slide contact points which are devided into two groups 212 and 214 along with the axial direction is arranged at equal distance around the surface of the contact point base 210 to the circumferential direction with the longer side of the sliding contact points being parallel to the axis P. Each of the slide contact points is shorted on its both ends by short rings 212a, 212b, 214a and 214b, and the short rings 212b and 214b are connected to terminals 224 and 226 by way of brushes 224a and 226a. Brushes 216 and 218 are pressed to the slide contact points 212 and 214 via a supporter 228 with a certain pressure. The voltage of a battery 222 is applied to the brushes 216 and 218 by way of the supporter 228 and the resister 220.

Figure 7:
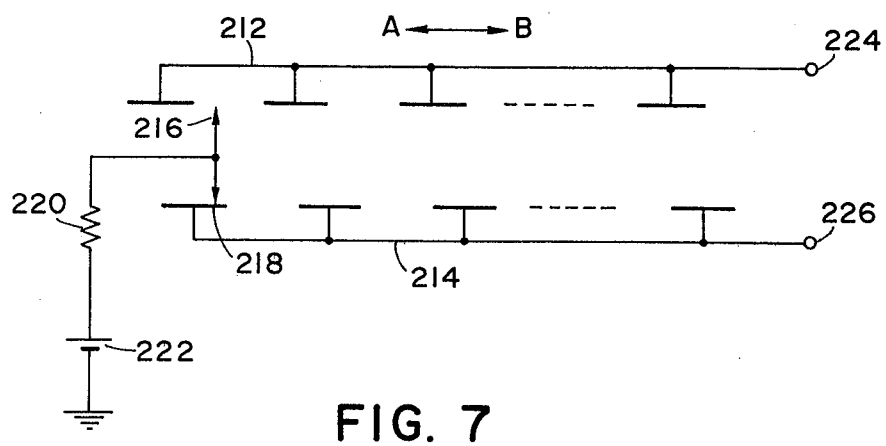
FIG. 7 is an illustration describing a principle of the device shown in FIG. 6.

FIG. 7 further describes the device shown in FIG. 6 and the like referenced numerals denote like elements in FIG. 6. In FIG. 7 each of the slide contact points 212 and 214 is arranged at the place of different phase and can be moved to the A-B direction with such phase relation being kept and with the movement of the measuring members.

Figure 8:
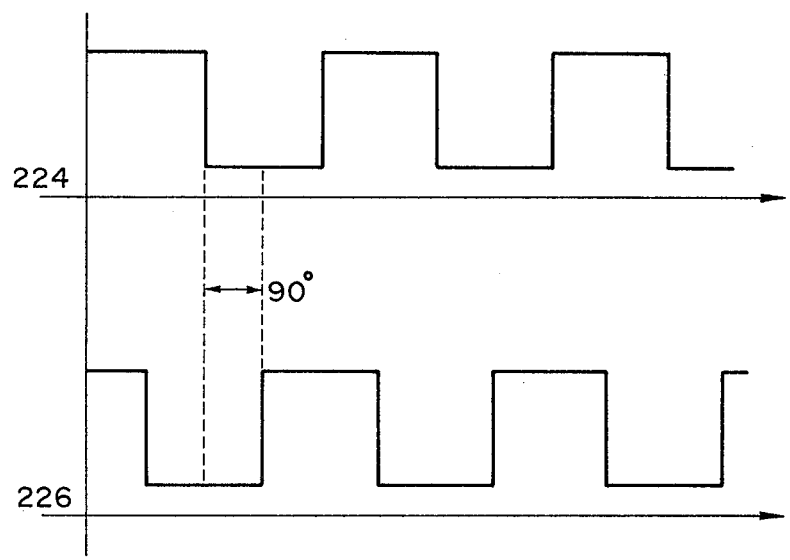
FIG. 8 is a wave form chart of the output of the device shown in FIG. 6.
Figure 13:
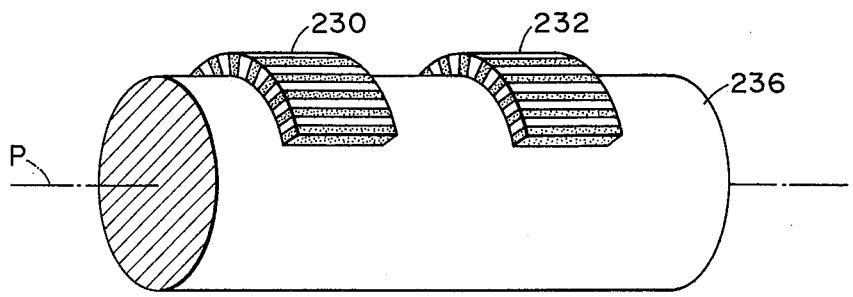

In this embodiment, when the measuring members move along to a cerain direction, the contact point base 210 revolves to repeat on and off contact of brushes 216 and 218 with each of slide contact points 212 and 214 respectively. Consequently, there appears a rectangular voltage signal having different phase at the terminals 224 and 226 as shown in FIG. 8. When the phase related position of each slide contact point is certainly determined, two rectangular wave signals can be obtained at the terminals 224 and 226 at phase difference of 90 degrees as shown in FIG. 8 and useage of both signals increases measuring accuracy and resolution, and distinguishes the moving direction of the measuring members.

In this embodiment, each of the slide contact points are arranged in a regular order around the surface of the column type contact point base 210 with its longer side being parallel to the axis P. It is technically easy to arrange the slide contact points with firm and constant distance as mentioned in the above, and, therefore, numbers of the slide contact points can be increased with extreme ease. Consequently, the measuring apparatus using the device described in this embodiment can be small sized and easy to be operated. As shown in FIG. 6, in case the slide contact points 212 and 214 are prepared separately with regard to the axial direction, the diameter of the contact point base 210 does not increase. Accordingly, when this embodiment device is utilized in micrometers, a spindle penetrating portion does not become convex and micrometers being operated by one hand can be manufactured. In addition to the above, in case the rotary type encoder is assembled into micrometers, parallelism, perpendicularity, and coaxialization must be firmly secured in relation with the spindles, etc. In column type encoder according to the present invention, however, coaxialization is only required and production assembly and adjustment of the parts are remarkably improved. It is also evident from its composition and production process that the coaxialization can be secured easiest among the formerly mentioned three conditions.

It is also technically easy to obtain columnar objects with perfectly circular section and to firmly find out the axial center. In the device of this embodiment shown in FIG. 6, the perfectly circular section and the axial center of the columnar contact point base 210 can be firmly obtained. Accordingly, in the device of this embodiment shown in FIG. 6, the slide contact points 212 and 214 do not incline against brushes 216 and 218, and contact pressure is always kept constant between the slide contact points 212 and 214 and the brushes 216 and 218. Consequently, the device of this embodiment does not include any noise in the rectangular wave signal and the measured results of the measuring device do not generate any error.

In FIG. 9 shown therein is the fifth preferred embodiment in accordance with the teachings of the present invention, wherein like referenced numerals denote like elements in FIG. 6 and the description will be omitted.

This embodiment has such advantage that a hollow column is used for the contact point base 210.

This embodiment also has such advantage that the moment of inertia is small in the contact point base 210 and that the slide contact points can be arranged inside and outside of the contact point base 210.

In FIGS. 10, 11, 12 and 13 shown therein are the sixth preferred embodiment in accordance with the teachings of the present invention, wherein like referenced numerals denote the elements in FIG. 6 and description will be omitted.

This embodiment has an object to provide proportional contact pressure between each brush and the slide contact points in case a plurality of brushes are utilized.

In Figures the hollow column is used for the contact point base 210 and the slide contact points are installed on the inside of circumference of the contact point base 210. The contact point base 210 is fixed to a base plate, which is not illustrated, and a plurality of same shaped brushes 230, 232 revolve together with the measuring members with repetition of alternate on and off contact with slide contact points.

As shown in FIG. 11, each of the brushes 230 being used in this embodiment is fixed to a supporting shaft 236 which is fixed a revolving shaft 234 coaxially to the axis P of the revolving shaft 234, which rotates with the movement of the measuring members. On the side of the supporting shaft 236 there is formed a groove 238. The brushes 230 are floated in the groove by springs 240 and 242 which are supported by the supporting shaft 236. The supporting shaft 236 is made of conductor, and a lead wire 244 is connected between the supporting shaft 236 and the brushes 230. A resistor 220 and a battery 222 are connected to the supporting shaft 236 in the same way with the embodiment described in FIG. 6. The contact surface of the brushes 230 and 232 with the slide contact points is shaped like a circular arc along with the inner surface of the columnar contact point base 10.

The brushes 230 are weakly pressed to the slide contact points when the supporting shaft 236 stops still, and are strongly pressed gradually to the slide contact points by centrifugal force as the rotation of the supporting shaft 236 increases. Consequently, the brushes 230 can be pressed and contacted to the slide contact points at the same pressure with other brushes 232 installed in the same way. The brushes 230 and 232 are installed at the position having same angle around the circumference of the axis P since the slide contact points are arranged in different phase positions to the direction of axis P. Consequently, the rectangular wave signals having different phases can be supplied.

Figure 14:
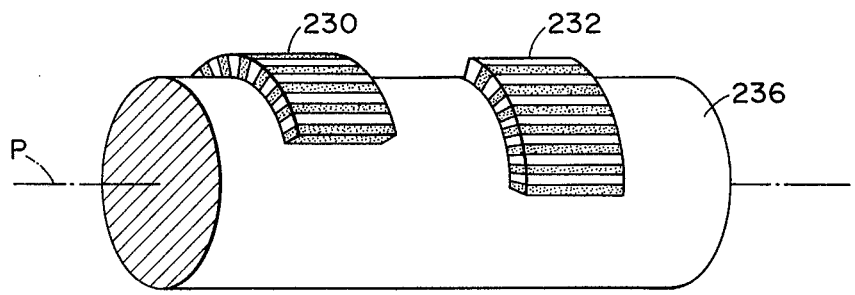
FIG. 14 is an illustration showing composition of the seventh preferred embodiment in accordance with the teachings of the present invention.
Figure 15:
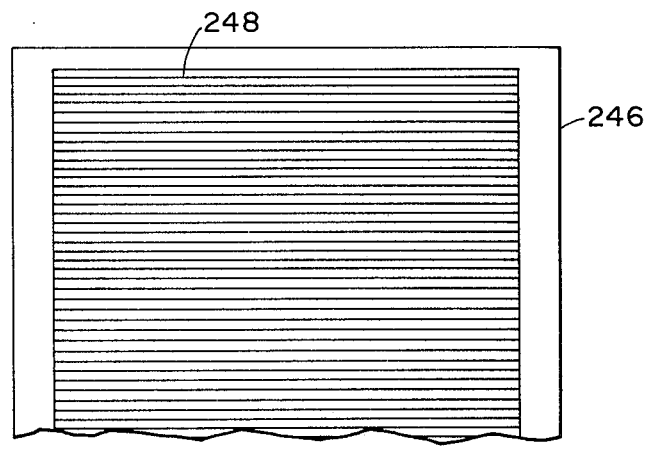
FIG. 15 is an illustration showing an example of sliding contacts.

In FIG. 14 shown therein is the seventh preferred embodiment in accordance with the teachings of the present invention, wherein like referenced numerals denote like elements in FIG. 12.

In FIG. 14 considered is such case that it is difficult to arrange a plurality of slide contact points having different phases on the inside of the circumference of the contact point base 210 as per the sixth embodiment.

In FIG. 14 the contact point base 210 is not illustrated. On the inside of the circumference of the contact point base arranged are two groups of slide contact points at the same phase position. To these two groups of the slide contact points on the inside of the circumference of the contact point base 210 contacted are the brushes 230 and 232 which are installed at different angle position around the circumference of the axis P.

This embodiment has such advantage that in case a plurality of slide contact points are installed on the inside of the circumference of the contact point base 210, each of the slide contact point groups becomes same phase and can be easily positioned.

As described heretofore, according to the present invention, the diameter of the contact point base can be minimized to make small measuring device, and the measured results do not include error since the slide contact points and the brushes can be contacted at constant pressure.

Furthermore, in the present invention, in case the hollow column is used for the contact point base, it is preferrable to utilize this with the fast moving measuring members and the brushes can be installed on the inside and the outside of the circumference of the contact point base.

In case the contact point base is hollow and fixed and the brushes are revolved, the contact pressure between the brushes and the slide contact contact points can be set proportionally. In this case, each of the slide contact points can be easily positioned in case the brushes are arranged at certain different angle position to the axial direction of the contact point base since each of slide contact point groups can be positioned at same phase.

Furthermore, in the present invention, the hollow column being utilized for the contact point base, the installation of the slide contact points on the inside and the outside of the circumference of the contact point base and the installation of the brushes repeating on and off contact at same phase can cope with dull rectangular wave signal output. It is also preferrable for the dull rectangular wave signal output that the brushes are installed so that the brushes can contact on and off with differently positioned slide contact points at same phase.

The device which the present invention is applied to is produced with extreme ease.

Mass production of the contact point base can be preferred by means of cutting off the columnar objects having predetermined diameter at the predetermined distance, and its firm assembly is performed with ease, which make shorter manufacturing process.

Since same material can be used for all the brushes, it is also advantageous for mass production.

Furthermore, the slide contact points can be obtained by such means that the conductive layers 248 is formed in advance on the film base 246 by means of deposit, etc. and is cut into certain size to be adhered on the circumference of the contact point base, and the manufacturing process is remarkably simplified. The device in accordance with the required accuracy can be easily manufactured with the basis of the difference of the diameter of the contact point base by such means that the distance of conductive layers in FIG. 14 is minimized as short as possible to be adhered on to the circumference of the contact point base having different diameter.

As described heretofore, the present invention can provide the contact point type encoder for the measuring device which is small for the size-wise and can keep constant pressure between the brushes and the slide contact points, and further, advantageous for manufacturing process.

What we claim is:

1. A contact point type measuring device having a contact point type encoder having scale contact points arranged in a regular order in a required direction and brushes correspondingly moving along together with moving members against said scale contact points in repetitive on and off contact with said scale contact points for supplying pulse type measured signals in accordance with the measured amount, a counter circuit counting the number of pulses of the measured signals, and a display section for the measured value for displaying the measured amount in a digital display in response to the counted value of said counter circuit, said contact type measuring device comprising:

scale contact points consisting of larger contact points arranged at a required distance and of small scale contact points dividing the larger scale contact point distance at a required pitch;

a counter circuit including a larger scale counter counting larger scale measured signals obtained from said larger scale contact points and a smaller scale counter counting small scale measured signals obtained from said small scale contact points and resetting such counted value by said larger scale measured signals; and a display section for the measured value including a upper figure displayer for displaying counted value of said larger scale counter as upper figures and a lower figure displayer for displaying counted value of said smaller scale counter at lower figures.

2. A contact point type measuring device according to claim 1 wherein resistors having different resistive values are connected to said larger scale contact points and to said smaller scale contact points, and said counter circuit includes a measured signal selecting circuit which selects and takes out the larger scale measured signals and the smaller scale measured signals in response to a voltage difference of the measured signals.

3. A contact point type measuring device according to claim 1 wherein said contact type encoder includes a column type contact point base having slide contact points arranged on and along its circumference in a regular order at a required distance, brushes correspondingly moving along the circumference direction against said contact point base in repetitive on and off contact with said slide contact points together with the movement of the moving members.

4. A contact point type measuring device according to claim 3 wherein said contact point base be solid or hollow and the slide contact points be installed around the outside surface of said contact point base.

5. A contact point type measuring device according to claim 3 wherein said contact point base be hollow and the slide contact points be installed around the inside surface of said contact point base.

6. A contact point type measuring device according to claim 5 wherein said brushes be supported via springs by a supporting shaft revolving with the movement of the moving members.

7. A contact point type measuring device according to claim 3 wherein said contact point base is hollow and said slide contact points are installed on both of the inner and the outer surfaces of said contact point base.

8. A contact point type measuring device according to claims 3, 4, 5, 6 or 7 wherein the slide contact point groups are installed in a plurality of rows to the axial direction of said contact point base and said brushes are prepared for every slide contact point group in order to contact on and off with the slide contact point groups at the same time.

9. A contact point type measuring device according to claims 3, 4, 5, 6 or 7 wherein a plurality of said brushes are installed to contact on and off with the different slide contact points in phase.

10. A contact point type measuring device according to claims 3, 4, 5, 6 or 7 wherein a plurality of said brushes are installed to contact on and off with the different slide contact points at a different phase.

11. A contact point type measuring device according to claim 8 wherein a plurality of said brushes be installed to contact on and off with the different slide contant points at different phase.

* * * * *